(12) United States Patent
Burke

(10) Patent No.: US 9,748,541 B2
(45) Date of Patent: Aug. 29, 2017

(54) ADVANCED LITHIUM POLYMER SYSTEM (ALPS)

(71) Applicant: Edmund David Burke, Santa Maria, CA (US)

(72) Inventor: Edmund David Burke, Santa Maria, CA (US)

(73) Assignee: Edmund David Burke, Santa Maria, CA (US)

( * ) Notice: Subject to any disclaimer, the term of this patent is extended or adjusted under 35 U.S.C. 154(b) by 25 days.

(21) Appl. No.: 14/249,646

(22) Filed: Apr. 10, 2014

(65) Prior Publication Data

US 2017/0141369 A1    May 18, 2017

Related U.S. Application Data

(63) Continuation of application No. 12/927,186, filed on Nov. 8, 2010, now abandoned.

(Continued)

(51) Int. Cl.

| | |
|---|---|
| *H01M 4/00* | (2006.01) |
| *H01M 2/10* | (2006.01) |
| *H01M 10/0525* | (2010.01) |
| *H01M 10/0565* | (2010.01) |
| *H01M 10/615* | (2014.01) |
| *H01M 10/48* | (2006.01) |
| *H01M 2/34* | (2006.01) |
| *H01M 10/625* | (2014.01) |

(Continued)

(52) U.S. Cl.
CPC .......... *H01M 2/1094* (2013.01); *B64G 1/10* (2013.01); *B64G 1/42* (2013.01); *G01R 31/3679* (2013.01); *H01M 2/1077* (2013.01); *H01M 2/34* (2013.01); *H01M 10/0525* (2013.01); *H01M 10/0565* (2013.01); *H01M 10/486* (2013.01); *H01M 10/615* (2015.04); *H01M 10/625* (2015.04); *H01M 2010/4271* (2013.01); *H01M 2200/00* (2013.01); *H01M 2220/20* (2013.01)

(58) Field of Classification Search
CPC combination set(s) only.
See application file for complete search history.

(56) References Cited

U.S. PATENT DOCUMENTS

| | | |
|---|---|---|
| 5,534,366 A | 7/1996 | Hwang et al. |
| 6,043,629 A | 3/2000 | Ashley et al. |
| 7,304,453 B2 | 12/2007 | Eaves et al. |

(Continued)

*Primary Examiner* — Imran Akram

(57) ABSTRACT

An Advanced Lithium Power System (10) that employs lithium polymer pouch cells and operates in all environments from atmospheric pressures, upward and through to the harsh and demanding realm of a space vacuum, including any aerospace related environments of launch, flight or operation for satellites, missiles, rockets and aircraft, being comprised of any number of stacked flat lithium polymer battery cells physically arranged and integrated within a constraining packaging enclosure that maximizes safety and power density while mitigating the debilitating effects of shock, vibration, thermal cycle, vacuum, radiation and electromagnetic interference, and simultaneously communicates electronically with a battery management system, providing instant autonomous cell protection, balancing and electronically isolated real-time monitoring of all individual cell parameters of voltage, current, temperature, state of charge and internal resistance, down to the individual cell level.

5 Claims, 5 Drawing Sheets

Related U.S. Application Data

(60) Provisional application No. 61/281,611, filed on Nov. 20, 2009.

(51) Int. Cl.
  *B64G 1/42* (2006.01)
  *B64G 1/10* (2006.01)
  *G01R 31/36* (2006.01)
  *H01M 10/42* (2006.01)

(56) References Cited

U.S. PATENT DOCUMENTS

| | | |
|---|---|---|
| 8,330,420 B2 | 12/2012 | Kim et al. |
| 8,386,175 B2 | 2/2013 | Limbaugh et al. |
| 2007/0218353 A1* | 9/2007 | Straubel ............... B60L 3/0046 429/120 |
| 2007/0238008 A1* | 10/2007 | Hogan .................... B60R 13/08 219/458.1 |
| 2008/0291623 A1 | 11/2008 | Genin et al. |
| 2009/0023057 A1* | 1/2009 | Kim ................... H01M 2/0207 429/120 |
| 2009/0267799 A1 | 10/2009 | Laborde |
| 2010/0114512 A1 | 5/2010 | Cotton et al. |
| 2010/0304250 A1* | 12/2010 | Chan ................... H01M 10/656 429/430 |
| 2011/0091760 A1* | 4/2011 | Straubel ................ B60L 3/0046 429/120 |
| 2011/0282807 A1* | 11/2011 | Colello .................. G06Q 50/06 705/412 |
| 2012/0263999 A1* | 10/2012 | Gunji ............... H01M 10/0525 429/156 |
| 2013/0143090 A1* | 6/2013 | Hosoya ............. H01M 10/0587 429/94 |
| 2014/0093760 A1* | 4/2014 | Hermann ............... H02J 7/0075 429/66 |
| 2014/0099558 A1* | 4/2014 | Itakura .................. H01M 4/587 429/336 |
| 2014/0255748 A1* | 9/2014 | Jan ........................ H01M 2/202 429/120 |
| 2014/0302360 A1* | 10/2014 | Klammler ........... H01M 2/1072 429/72 |
| 2014/0356717 A1* | 12/2014 | Gunji ..................... C01G 53/56 429/221 |

* cited by examiner

Figure 2  ICP1 through ICPx

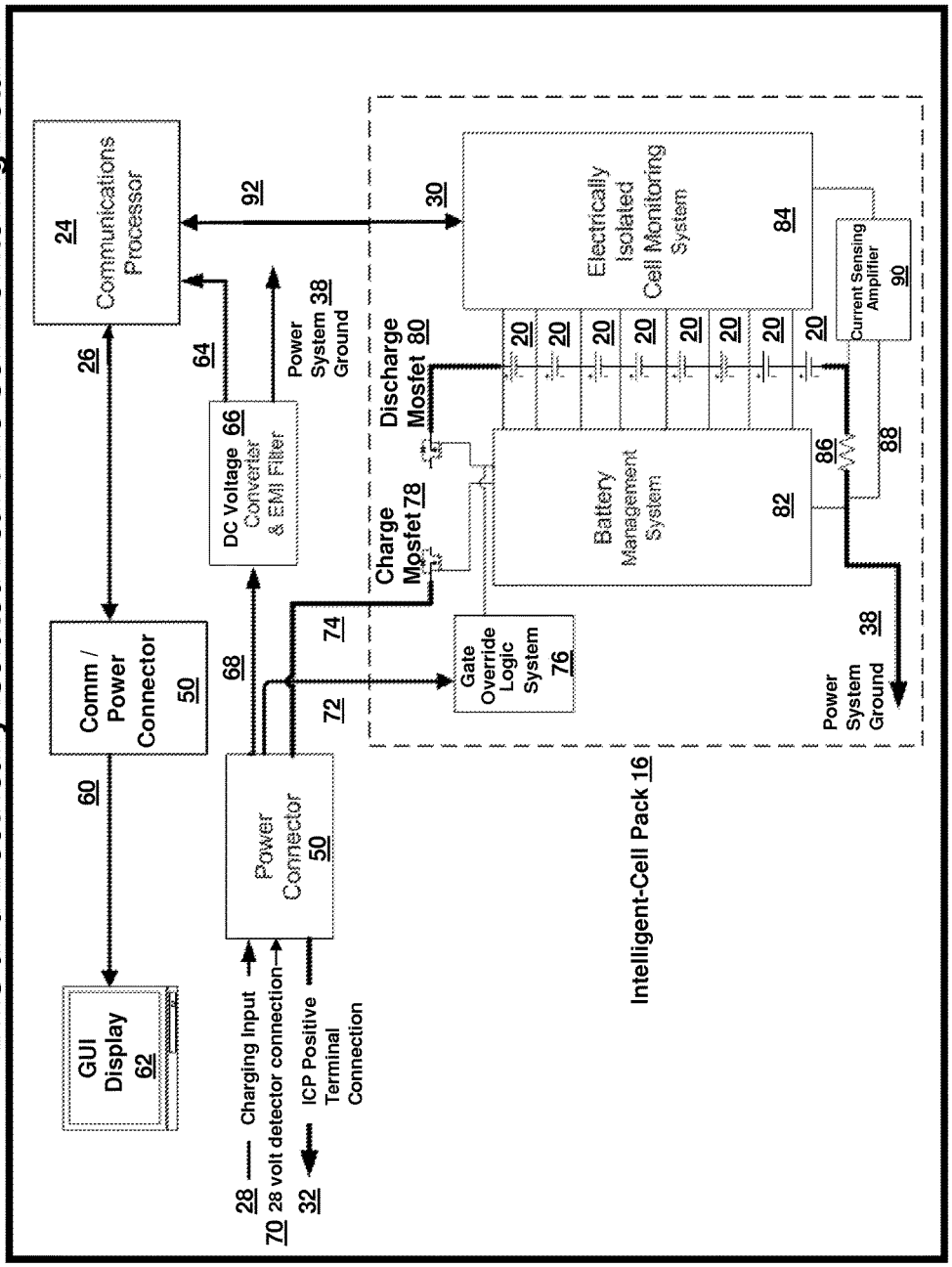
Figure 5  BMS and Electrically Isolated Real-time Cell Monitoring Detail

ADVANCED LITHIUM POLYMER SYSTEM (ALPS)

This application is the formal patent submission based upon the Provisional Patent No. 61/281,611 tided, "Scalable, Modular and Intelligent Power System" issued on 20 Nov. 2009, and is a Continuation in Part of "Scalable, Modular and Intelligent Power System", application Ser. No. 12/927,186 filed on 9 Nov. 2010.

BACKGROUND

The following is a tabulation of prior art that presently appears relevant:

| Pat. No. | Kind Code | Issue Date | Patentee |
|---|---|---|---|
| 5,534,366 | B1 | Jul. 9, 1996 | Hwang et. Al. |
| 6,043,629 | B1 | Mar. 28, 2003 | Ashley et. Al. |
| 7,304,453 | B2 | Dec. 4, 2007 | Eaves et. Al |
| 8,330,420 | B2 | Dec. 11, 2012 | Kim et. Al |
| 8,386,175 | B2 | Feb. 26, 2013 | Limbaugh, et. Al |

| Pending Patent Applications | Pub Date | Applicant |
|---|---|---|
| US 2008/0291623 | Nov. 27, 2008 | Genin et. Al |
| US 2009/0267799 | Oct. 29, 2009 | Laborde, Gregory |
| US 2010/0114512 | May 6, 2010 | Cotton et. Al |
| US 2014/0093760 A1 | Mar. 4, 2014 | Hermann, W.A. |

The rapidly emerging small satellite markets, especially those that weigh less than a pound, and extending up into the 100 pound plus range, along with weight sensitive launch vehicles require the delivery of robust, safe and reliable power as their larger satellite and launch vehicle provider counterparts do. Unfortunately the large legacy battery chemistry systems such as silver-zinc, lead acid, nickel cadmium and lithium-ion deployed throughout the aerospace industry on missiles, rockets satellites and high altitude systems are not adaptable in architecture or design philosophy to accommodate these smaller size satellites or weight sensitive launch vehicles, and as a result, there is no safe, modular, scalable, expandable, deployable, employable, practical, radiation hardened and intelligent battery system available to efficiently power this new genre of satellites, weight sensitive launch vehicles, or other niche areas where similar operational requirements may exist. The greatest battery power density is achieved only when flat lithium polymer pouch cells are stacked flat upon each other such as widely utilized in the remote control model aircraft hobby industry and growing personal electronics industry, and as yet, there is no invention or deployment of a multiple flat cell lithium polymer battery system which is available or adaptable that can be consistently employed in the all-encompassing spectrum from a simple atmospheric pressure environment employment all the way through to the harshly demanding environments experienced on missiles, rockets, high altitude aircraft and small satellites where they are greatly needed for their power density. The bottom-line is that to date, nobody has yet understood the nuances required to successfully employ a flat pouch lithium polymer battery system in the harshly demanding environments of the above detailed applications, so their use has thus been contained fully contained within the benign environmental realm of the earth's atmosphere or in similarly protected pressurized vessels such as the space station or within the pressurized and temperature controlled cabin of a spacecraft.

Relatively simple terrestrial-based lithium polymer battery systems presently power countless portable consumer devices (cell phones, PDAs, etc.) for extended hours without recharge, and has enabled a revolution and proliferation of these consumer devices on a mass scale. While it may seem logical that these existing basic lithium polymer systems could be simply adapted for use in the harsh environments/aerospace operational realm for use on small satellites, missiles and rockets, that is not the case. In order to harness and leverage the attributes of the lithium polymer battery into an unprotected and highly demanding aerospace environment, a design, architecture and implementation revolution needed to take place, with this invention being the result of that revolution.

By integrating the requirements of safety, modularity, scalability, expendability, deployability, employability, practicality, radiation hardening and intelligence control into the unprotected operational envelope required of a small satellite, missile, rocket or any high-value vehicle which may be size or weight sensitive and is deployed in a harsh environment, one arrives at this invention which solves the problem of how to provide the world's most dense power source, which is pouch-based lithium polymer for use in the whole spectrum of applications from a benign earth based use, upward, through and into the harsh environment of space.

Current high-tech and heritage aerospace power applications have not yet contemplated the path forward with these flat pouch cell lithium polymer batteries, and are generally still locked into using the older legacy rechargeable battery chemistries such as silver zinc, nickel-cadmium, nickel metal hydride, lithium-ion and lead acid to power their missions. Batteries built using these technologies are routinely heavy and subject to expensive qualification testing and extensive pre-flight checkout in order to ensure their mission readiness as much as possible. These battery systems provide minimal real-time health status feedback, minimal protection and they are not modular or expandable in design. Additionally, with the cost to orbit generally in the $20,000 per pound of weight range, a vehicle is typically 100-300 pounds heavier than it could be if all its batteries were switched to lithium polymer pouch cells. With this switch to lithium polymer batteries alone, approximately 3-9 million dollars of additional payload space and weight could be sold to boost profits or provide additional capability when launched on a missile or rocket system.

Some progress however has been made in the use of non-polymer lithium-ion batteries on aerospace vehicles to deliver far more energy density than other legacy battery systems in a smaller package size. For example, many large satellites successfully utilize straight lithium-ion chemistry very successfully. Contrary to this, the noteworthy press about the 787 Dreamliner's unsuccessful employment of lithium-ion batteries resulted in various aircraft fires that greatly jeopardized safety, and caused extended costly aircraft groundings. To date, the Dreamliner's lithium-ion battery root cause of failure is still not thoroughly understood due to the lack of the ability to monitor each individual cell (their employed brand "Yuasu Cell" has three parallel cells in one canister enclosure, and root cause was not found in that there was no technical insight into the failure mode at the individual cell level). In this Dreamliner scenario, it is well understood that electrolyte leakage of a lithium-ion cell caused an electrical short that lead to battery fire, however the mechanism of how and why it happened is not understood. Subsequent to these fires, and in combination with the lack of full understanding the problem, their design solution was to entomb their lithium-ion batteries in a very fireproof enclosure, and not solve the problem with a robust design as detailed in this invention.

The advanced lithium polymer battery system of this invention in comparison does integrate multiple series and parallel cells, however each individual cell is monitored real-time, and comprehensive protection exists at the cell level. Lithium polymer has very little electrolyte and therefore does not leak liquid electrolyte that can result in a fire, and hence greatly decreases the risk of any battery fire that could be caused by a short circuit from electrolyte leakage such as with baseline lithium-ion technology. Simply put, it is not a safe or acceptable solution for a deployed lithium-ion battery system such as in the Dreamliner to exist where expensive property or human life is at risk. For aircraft carrying passengers, rockets, missiles and satellites, an advanced lithium polymer battery system as detailed in this invention should be employed instead to reduce space, weight, and increase safety.

Given the current state-of-the art 'either or/or' situation regarding the choice of using either a heavy legacy battery, a lithium-ion one, or the totally inadaptable consumer grade lithium polymer battery systems such as employed in the remote control model industry, to the best of our knowledge, there is no existing prior art regarding an advanced lithium polymer system as described therein by this patent which can be scaled in size to meet the operational envelope smaller nano/micro satellites and retain the capability to also scale up within its architecture to accommodate even the largest satellites, missiles, rockets or aircraft, or be used without modification of design principles for use in any spectrum of employment from a benign earth based atmosphere, all the way through the harsh environment of space or during transport between the two locations.

While nobody has arrived at a practical, employable and complete integrated solution as detailed by this invention, there are a limited number of inventions addressing broad concepts which are of no help to arrive at the specific intention of this invention. A modular battery pack invention by Hwang et al. only concerns itself with physical battery mounting interfaces for easy modular replacement. The modular control electronics for batteries invented by Ashley et al. only addresses the modular control methods for charging each battery cell to protect the batteries and optimize their performance. Eaves et al. describes an arrangement of two or more cells mounted to a card, with the card or cards then being integrated within an enclosure. With Eaves's arrangement as intended and designed, it is not possible to create a robust structural system that is small enough or light enough to also survive the operational requirements and rigors of a space launch or an orbital environment. Kim's invention only essentially concerns itself with switching out a faulty battery cell via a very complex switching and wiring arrangement, requiring a whopping 10 wires to be attached to each cell in the switching array (in his FIG. 1, note that there are two wires for sensing, two heavy gauge terminal wires and six switching wires around each cell, comprising ten total, which would result in 80 wires required for a nominal eight cell battery) or potentially thousands of wires accumulating into a bundle with the employment of a high voltage large scale battery, and subsequently would be an integrated size/weight packaging nightmare and complexity when the additionally required hardware components such as mosfet switches are integrated. Kim even implies that his approach would be unwieldy to employ on a practical scale in his sixth paragraph under the 'background' section of his patent, thus making it impractical for use on an aerospace vehicle, let alone it also complying as a safety critical application. Limbaugh's invention does not attempt to broach the subject of how to design and build a safe and robust power system, however he does mention the need for aerospace platforms to survive intense shock, vibration temperature and acceleration environments, which is all common sense, but offers no hint on how to accomplish this with a lithium polymer battery application. Genin in his pending patent application discusses the importance of an aerospace qualified enclosure mitigating electromagnetic interference, however no reference is made to a design architecture incorporating the capability to manage the real challenge of how one safely and successfully employs lithium polymer batteries in a safety critical environment. Laborde teaches the employment of a data recorder for general aviation aircraft, and the importance of an emergency crash recorder surviving a high-dynamic acceleration crash, however again, no mention about the intricacies of how to design and practically deploy an aerospace application worthy lithium polymer battery system, which requires infinitely more than just crash considerations. Cotton teaches about the importance of monitoring battery parameters (output voltage, impedance, resistance and temperature) via a graphical user interface (GUI) with many batteries in a large-scale backup battery system. FIGS. 1-24 show monitoring output voltage, impedance, resistance and temperature of may battery units via a GUI, but again, neither does Cotton tackle the challenge of working with lithium polymer batteries, and furthermore does not discuss the critical importance of monitoring individual cells real-time (see FIGS. 2 thru 24) contained in the many battery units within a large scale battery system for commercial and/or industrial backup power (see patent paragraph 0003), and as such is not practical for employment in a reduced space and weight harsh aerospace environment, neither is Cotton's complete battery nor are his cells similar in any way to lithium polymer pouch cells or even regular cells. Finally, Hermann primarily discusses the physical arrangement/packaging of battery cells, and only briefly mentions the concept about a Battery Management System in his paragraph 71, but offers no details to even imply he is concerned about the details of how its complexity is administered as detailed in this invention of how we protect, balance and monitor each cell for safety. Additionally, while Hermann mentions a packaging/arrangement concept for his cells, he never goes into the functionality of those cells in that packaging scheme enduring the rigors of a space launch where shock and G levels are so Intense that compression mounting alone will lead to the tearing of a cell pouch, neither does he speak of functionality in orbit where no atmospheric pressure is compressing the cells. Instead, Hermann chooses to only speak about compression plates of sorted designs (spring, foam etc.) to deal with cell expansion and contraction during charge and discharge, and he never mentions the concept of a dynamic slip surface between the cells and his compression structure to eliminate the possibility of tearing a cell pouch. Additionally, while Hermann cites in claim 11 that his 'battery stack compressible structure' functions from 60-100 degrees C., his scheme does not accommodate the extreme temperatures of space which range from minus 270 C to plus 120 C.

Due to the nature of these inventions or any currently deployed state-of-the-art systems, none of them can be adapted to even approximate the intent and demands of efficiently designing, integrating, managing and deploying a practical pouch style lithium polymer battery system on smaller satellites or size and weight sensitive missiles or rockets or scaled up architectures of practically any size in any environment from benign earth-based through and into space-based for the following reasons:

(a) There is no practical system or architecture available to provide miniaturized real-time monitoring/feedback of multiple arrays of deployed lithium polymer batteries to enable instant determination of their individual cell safety critical parameters (voltage, current, state of charge, state of health, and temperature) during readiness for flight or flight itself.

(b) Rapid and efficient lithium polymer battery cell conditioning and balancing is not possible within the architecture of these prior art inventions or any employed systems if employed on a satellite or launch vehicle.

(c) No capability exists for real-time data gathering from all lithium polymer cells comprising a battery which could be used on a small satellite or weight sensitive launch vehicle, and if it did in accordance with existing architectures, it would require large accumulating bundles of wires as the number of cells grew past just a handful.

(d) It is not possible to efficiently protect any existing lithium polymer battery system from an over charge, under voltage and short circuit situation on an individual cell basis if the number of cells and subsequent battery size is a large and complex matrix expansion, nor is this large matrix expansion adaptable for use on smaller nano/micro satellites or weight sensitive launching systems.

(e) No efficient and deployable fail-over/safe system exists to ensure functionality if a single lithium polymer cell fails within a battery being attempted for use on a small satellite or any mission and safety critical aerospace vehicle.

(f) All present battery system designs negate their practical adaption for use with lithium polymer chemistry, nor are they practical or deployable in any manner in a standard configuration or an efficient modular 'Lego' system architecture, either in a physical arrangement or electrical one.

(g) The limited design flexibility of existing deployed aerospace battery systems make them inadaptable to lithium polymer chemistry, and thus precludes the possibility of their integration with a real-time battery management system that could take advantage of the increased characteristics that could be demonstrated of this were possible.

(h) Present practical battery design configurations are limited to their individual unique manufacture, and do not allow for their physical or electronic adaptation into lithium polymer chemistry for use on small satellites or weight sensitive launch vehicles.

(i) Existing deployed battery systems are not adaptable to small satellites or weight sensitive launch vehicles, and therefore do not incorporate methodology for isolating/combining battery strings via software command in the event that mission requirements change real-time, or if a battery has an internal failure.

(j) All of today's battery systems for aerospace use are based upon older technologies or rely on large satellites to carry them, and are size/weight excessive in addition to being very inefficient in architecture when compared to the advanced lithium polymer system of this invention.

(k) In addition to power density and unwieldy architecture problems that accompany the limiting factors encountered in fielding older battery technology or proposed lithium polymer technology, these approaches suffer from significant operations and maintenance issues and costs related to access, recondition and service the batteries, especially if they are being considered for use on small satellites.

(l) Thermal packaging issues presently plague all aerospace battery designs due to their inefficient systems architecture and higher cell internal resistance compared to Lithium polymer implementation, with no cost effective way to circumvent them due to their size and non-scalability for use on smaller, more efficient vehicles.

(m) Launch environments are presently extreme to standard battery systems that are flown, and cause labor intensive and costly pre-qualification testing methods to be employed to mitigate potential problems from surfacing during the operational employment of these existing systems.

(n) Size and weight issues constantly arise during consideration of, or employment of existing battery systems, resulting in the sacrifice of other mission capabilities.

(o) Current aerospace application battery systems are limited by the arrangement of cells and their large amount of individual wiring to develop a particular battery voltage and capacity, and are not easily reconfigured in the event of a change in mission rules or application requiring a change in voltage or current capacity, nor are their designs applicable for packaging lithium polymer pouch cells where the battery thickness increases during charge and decreasing during discharge. Also, the pouch cell material will tear under extreme high shock (1000 s of Gs) and vibration (30-100 GRMS) without a dynamic packaging mechanism that is included in this invention.

(p) Fielded aerospace battery systems, lithium polymer or not, are incapable of providing a practical deployable method to instantaneously monitor individual cells on a practical real-time basis, predicting a battery cell failure with a battery prognostic algorithm by monitoring each cell performance during charge and discharge, and thus precluding the capability to notice and avoid a battery cell failure before it happens, whether in a small or larger scale battery.

(q) Today's battery systems do not employ an efficient and deployable architecture for use on smaller satellites or weight sensitive launch vehicles to enable the capability for predictive performance in accordance with the number of cycles it has been subject to.

(r) Present battery architectures do not allow for a larger method of control aside from the immediate system they are employed within, thus eliminating the possibility of mesh network control in a swarm of small satellites, and an efficient redundant power switching employment.

(s) No lithium polymer battery systems exist today that can function and be monitored real-time down to the cell level in the severely demanding environments of missile/rocket launch or space.

(t) Existing battery systems cannot be scaled from small to large in a practical way that maintains simplicity of integration and operation.

(u) Deployed battery systems do not have the capability to rapidly and fully recharge within the approximate 45-minute timeframe of a low earth orbit in the sun from a fifty percent depth of discharge.

(v) Existing terrestrial employments of pouch style lithium polymer systems will not work in the vacuum of space without proper thermal packaging.

(w) No pouch-style lithium polymer system to date can monitor individual cell parameters in real-time.

(x) There are no pouch-style lithium polymer battery systems that are dynamically packaged to survive the rigors of space-launch (extreme shock, vibration and electromagnetic interference), and the harsh environments of space (thermal cycle, vacuum and radiation).

(y) Present pouch-style lithium polymer applications do not employ a method for accommodating the expansion and contraction of multiple stacked cells during battery charge and discharge due to the benign environments they always operate in.

(z) Presently employed pouch-style lithium polymer systems have never developed an interface for remote cell monitoring via a telemetry system.

SUMMARY

All of these shortcomings clearly illustrate that nobody has taken the necessary leadership to consider all the complex aspects required to integrate lithium polymer chemistry into a safe, modular, scalable, expandable, deployable, employable, practical, radiation hardened and intelligently controlled system for use in any environmental spectrum from a benign ground-based atmosphere dependent one through the harsh environments typically encountered on aerospace or similarly demanding platforms operating in the upper reaches of the atmosphere or in the vacuum of space. It is clearly evident that thus far in human history, there are no candidates for the practical design, manufacture, certification and deployment of a lithium polymer battery system which is survivable on aerospace platforms such as small satellites, missiles, rockets, and other orbiting payloads, where scalability size from ounces upward are of paramount importance, while still maintaining the ability for use in a simple benign ground-based nominal atmosphere environmental application without any design philosophy modification.

ADVANTAGES

Accordingly, the main objects and advantages of this invention are that it be smartly designed for size, safety, modularity, scalability, expandability, deployability, employability, practicality, radiation hardening and intelligence control in any environment from the most benign to the most harsh, whether or not a human is directly involved operationally.

With this approach, a revolution can occur particularly in the nano/micro/small satellite, missile, rocket and unmanned aerial vehicle industries where the smallest, safest and most deployable lithium polymer battery pouch-style system is desired for use because of its outstanding power density.

In addition to the clear above-named advantages of our interpretation of the most practical form a lithium polymer battery power system for any spectrum of application from benign earth-based type employments through small satellite type or weight sensitive missiles and launch vehicles should take the form of without any design philosophy modification, this invention also benefits from the following important advantages:

(a) Its simplistic architecture in combination with its modular scalability allows for the building of any configuration of lithium polymer power system weighing in the ounce range up to practically no maximum limit, in the most efficient manner possible, with corresponding control software also being simplistically modular and scalable for instant interfacing with hardware, allowing for ease of monitoring individual battery cell voltages and temperatures.

(b) The minimal wiring architecture of this lithium polymer battery system results in a simplicity and elegance allowing instant access to the capability of conditioning and balancing of the individual battery cells on any size vehicle weighing from the ounce range up through practically no limit, while monitoring all cell's status prior to and after full system power-up.

(c) For the first time in lithium polymer battery history, it will be possible to efficiently gather real-time data on the live performance during flight of the individual cells that comprise a multiple cell miniature battery weighing only ounces up through the largest practical sizes, and subsequently utilize that data for real-time monitoring and historical health analysis using battery prognostic algorithms to detect a weak battery cell prior to failure within the system.

(d) Risk mitigation of the lithium polymer system's operation is monitored and controlled internally or monitored and controlled externally from over charge, under voltage and short circuit on an individual cell basis, and its employment is irrespective of the size of the final power system configuration due to its efficient architecture.

(e) Internal battery cell safety is attained through the ability to simply and elegantly detect and eliminate the debilitating effects of a single cell failure within the battery system.

(f) The main strength of this invention is that at its core, the primal capability exists for matrix-like scalability of the battery system rapidly and simultaneously in hardware/firmware/software to meet practically any system requirements that a user may define for their defined operations, and without the addition of cumbersome, heavy and complex wiring bundles.

(g) This lithium polymer battery system has an open architecture that can easily accommodate a synergistic interface with external power systems such as solar panels/fuel cells for charging and providing a new state of the art efficiency and dense power system for special new applications, including battery charging via direct, indirect or inductive methods, while being scalable from tiny sizes and weights in the ounces, with no appreciable upper limit size or weight limit.

(h) Customer needs are easily met on a rapid and efficient basis through employment of the unmatched simple architecture of the pre-defined components which makeup the intelligent power system which are scalable/modular in both hardware and software, with all interfaces being repeatable and expandable with practically no practical size/weight minimums or maximums, and no additional complex accumulating wiring as the system grows.

(i) All possible fail-over/fail safe capabilities are integrated into the lithium polymer battery system of this invention no matter its size, and will allow for redundancy and phase-over to a backup state of operation to insure mission success.

(j) Cost efficiency in combination with ultimate size, weight, power and safety are the guidelines of this lithium polymer battery system, allowing for a revolutionary application in pico-satellites, nano-satellites, any size satellite, missiles, rockets, unmanned aerial vehicles and other weight/size constrained systems such as those typically employed in the aerospace industry which can greatly benefit from a dense power supply in a fraction of the previous size/weight/volume envelope the aerospace field has never had available until this time.

(k) This lithium polymer battery system and any associated interfacing system such as a fuel cell or solar panel will greatly benefit from the almost non-existent operational maintenance which other power systems typically and continually require.

(l) The extremely safe and environmentally tolerant operational nature of this simple architecture lithium polymer power system allows for its utilization in practically any scenario that a user could conceive of in temperature extreme environments, and if the environment is of an extreme cold nature, ultra thin direct-current strip heaters can be layered between battery cells and powered by the cell itself with ample power margin remaining for completing the mission.

(m) A simple load test can be implemented on this lithium polymer battery system prior to use with individual cell monitoring providing the needed confidence that the battery system is ready for use. In combination with this, no additional environmental qualification testing is required due to the shock and vibration immunity of the entire system, in direct contrast to all other battery power systems currently supporting aerospace programs.

(n) The scalability and modularity of this lithium polymer power system allows for its use in an array of military, commercial and industrial applications requiring a very small mechanical footprint where size and weight are always an issue.

(o) If last minute mission needs change, the simple and repeatable design architecture of this scalable lithium polymer system in both hardware and software allows for rapid reconfiguration in its complex surrounding environment to accommodate any contingency of the system it is powering.

(p) The simple yet elegant nature of this miniature-capable lithium polymer power system lends itself to autonomous or real-time computer monitoring via a graphic user display, enabling the determination of an imminent yet rare unexpected battery cell failure while providing monitoring of the actual internal reconfiguration of the battery as it is happening.

(q) Massive amounts of data already resident in a lithium polymer battery database can be referenced against the archived data of this invention for predictive modeling in the event that a particular battery/cell has been subject to many recharging cycles, and credibly assessed with respect to its probability of failure during that actual cell's performance time being monitored.

(r) In advanced applications, it is entirely possible to employ a single or many integrated lithium polymer battery systems as defined in this invention, hybrid or not, within a mesh network's control, whereby the performance of these individual unit lithium polymer power systems can be automatically controlled/reconfigured upon demand for meeting any changing power needs as they occur, such as a in a swarm of pico, nano, or other satellites.

(s) The intent, architecture and design of the constrained lithium polymer battery cells in combination with ruggedized controlling electronics affords an integrated system that can survive the harshest environments of launch and space travel, from the smallest size in ounces, with no practical limit of scalability on the large end.

(t) The inherent design philosophy of this invention allows its form-factor to range from ounces in size through practically no limit due to its smart modular design that reduces wiring to absolute essential that minimizes size and weight unlike no other battery system.

(u) The low internal resistance of the pouch style lithium polymer z-fold battery assembly allows for it to be rapidly recharged from a dead state in less than half the time compared to other battery chemistries, and employing this technology on a satellite via this invention will be a first in the industry, allowing for full satellite battery recharging to occur from a 50 percent depth of discharge during a short 45 minute low earth orbit exposure time to the sun.

(v) This invention utilizes a never-before demonstrated method of constraining the pouch-style lithium polymer batteries so they won't expand in the vacuum of space or due to heating reasons, thereby avoiding cathode/anode plate separation and decreased capacity.

(w) For the first time, real-time monitoring of individual cells in a stacked pouch while on orbit or during critical aerospace applications will be possible.

(x) The dynamic packaging employed includes battery pack compression, thermally conductive foam and slip surface protection by this system will allow for its use in extreme environmental situations that include extreme shock (1000 s of Gs) and vibration (30 to 100 GRMS) to eliminate pouch material tearing and stress, and others such as working in an electro magnetic interference/radio frequency interference environment to military test standards.

(y) Precise accommodations are made for the cell thickness expansion during charge and cell thickness contraction during discharge of the pouch-style lithium polymer battery during its employment in any environmental regime from the most benign to the most demanding aerospace ones including the severe reality of the vacuum of space.

(z) The robust nature of this system which allows for its employment in all environments from the most earth-based benign through the harshest environment of space and the transit thereto while allowing for its continual connection and communication with a monitoring means, either directly via hardwire or remotely via telemetry over great distances, all without change or intent to its system design/implementation philosophy principles.

DRAWINGS

FIG. 5 depicts electrically isolated protection and real-time cell monitoring circuitry function detail for a mission and safety critical battery application thus increasing overall battery system safety.

Figure 1:
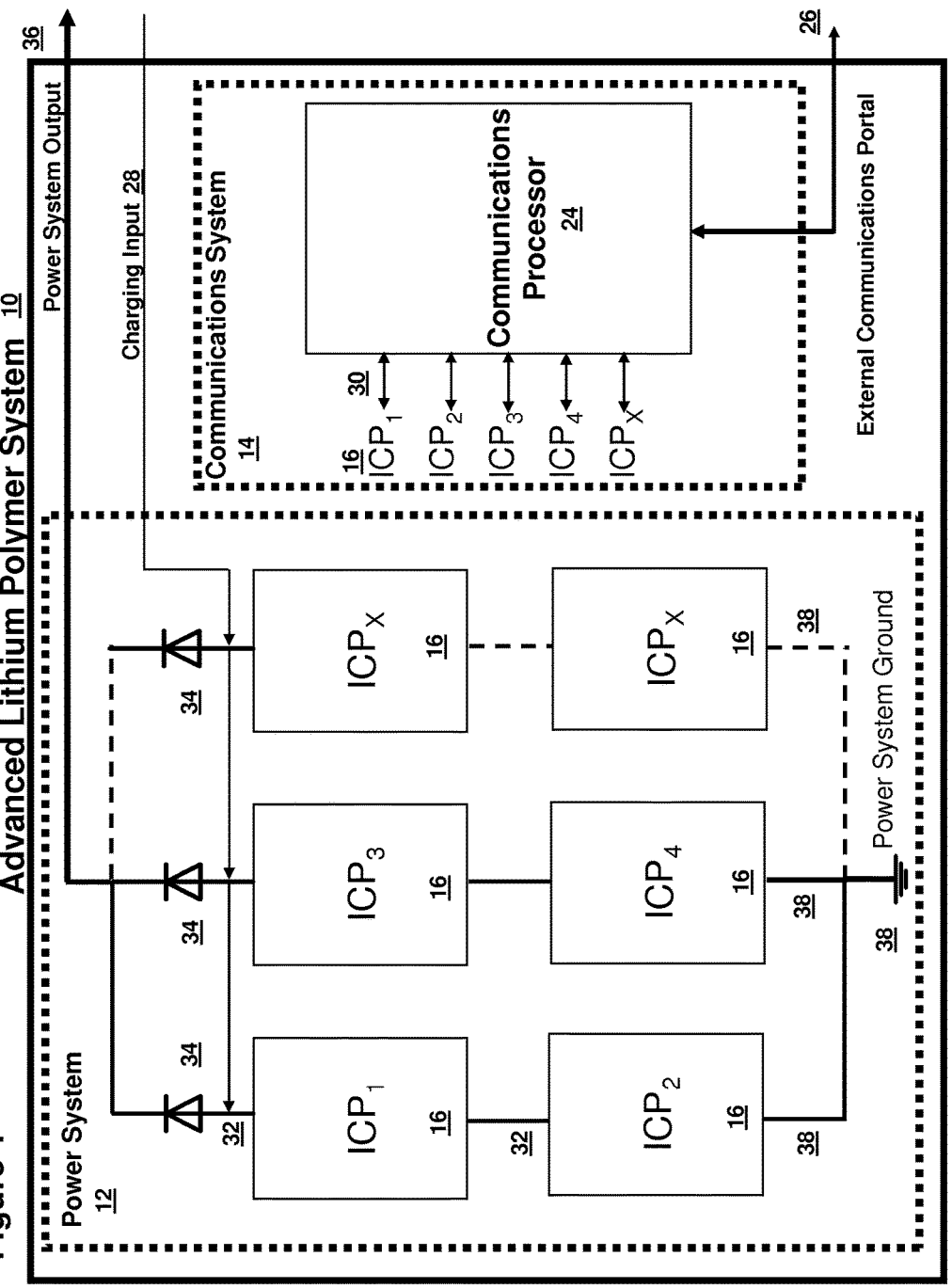
FIG. 1 is a functional external block diagram depicting the delineation of major system responsibilities within the Intelligent Cell Pack (ICP) of the advanced lithium polymer system.

REFERENCE NUMERALS IN DRAWINGS 10 advanced lithium polymer system
12 power system
14 communications system
16 ICP1 through ICPx
18 intelligent-cell electronics card
20 cells 1 through cell X
22 cells 1 through cell X output connection
24 communications processor
26 external communications portal
28 charging input
30 opto isolated I2C communication port
32 ICP positive terminal connection
34 schottky diode
36 power system output
38 power system ground
40 enclosure base
42 function integrated electronics card
44 cell heater strips
46 enclosure lid 48 enclosure securing screws
50 communications/power connector
52 interface harness
54 integrated stack
56 dynamic reactive foam
58 dynamic slip surface
60 GUI interface cable
62 GUI display
64 power cable
66 DC voltage converter and EMI filter
68 power cable
70 28 volt detector connection
72 override logic cable
74 mosfet power cable
76 gate override logic system
78 charge mosfet
80 discharge mosfet
82 battery management system
84 electrically isolated cell monitoring system
86 current sense resistor
88 current sense lead
90 current sensing amplifier
92 I2C communications cable

DETAILED DESCRIPTION

FIGS. 1-5

An advanced lithium polymer system 10 as illustrated in FIG. 1 consists of a power system 12, and a communications system 14. Power system 12 is comprised of a scalable ICP array of ICP1 through ICPx 16 isolated from each other via schottky diodes 34, with the combined power out put of ICP1 through ICPx 16 resulting in a final power system output 36, with its corresponding power system ground 38.

Figure 2:
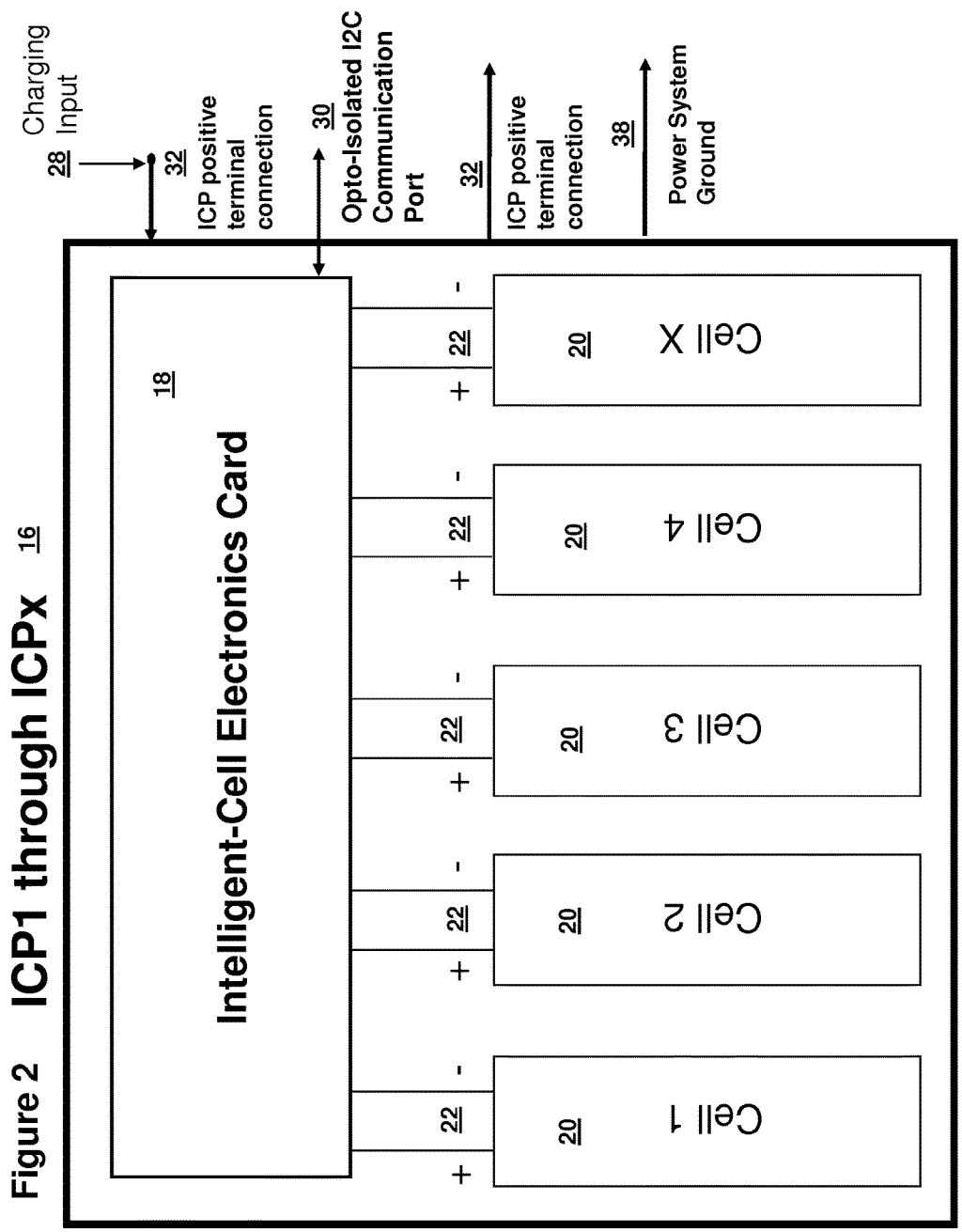
FIG. 2 is a block diagram of the entire interactive architecture of the advanced lithium polymer system's major components.

As illustrated in FIG. 2, a charging input 28 directly, indirectly or inductively recharges cells 1 through cell X 20 contained within ICP1 through ICPx 16 via ICP positive terminal connection 32. ICP1 through ICPx 16, each being comprised of an intelligent-cell electronics card 18 and a scalable array of cells 1 through cell X 20. Cells 1 through cell X 20 interface with intelligent-cell electronics card 18 via cells 1 through cell X output connection 22. Individual ICP1 through ICPx 16 cumulatively provide output power at ICP positive terminal connection 32.

In FIG. 1, communications system 14 is comprised of a communications processor 24 interfacing internally with each individual ICP1 through ICPx 16 via opto isolated I2C communication port 30, enabling bi-directional communications between power system 12 and the outside world via external communications portal 26.

FIGS. 1 and 2 together describe the complete advanced lithium polymer system 10 from the cell component level of cells 1 through cell X 20, in-turn through the ICP1 through ICPx 16 level, and subsequently showing how ICP1 through ICPx 16 forms the building block of power system 12. Also illustrated in FIGS. 1 and 2 is how communications system 14 interfaces with power system 12, and subsequently provides the power system output 36 in combination with demonstrating the ability of how communications with power system 12 occur, to form the complete advanced lithium polymer system 10.

Figure 3:
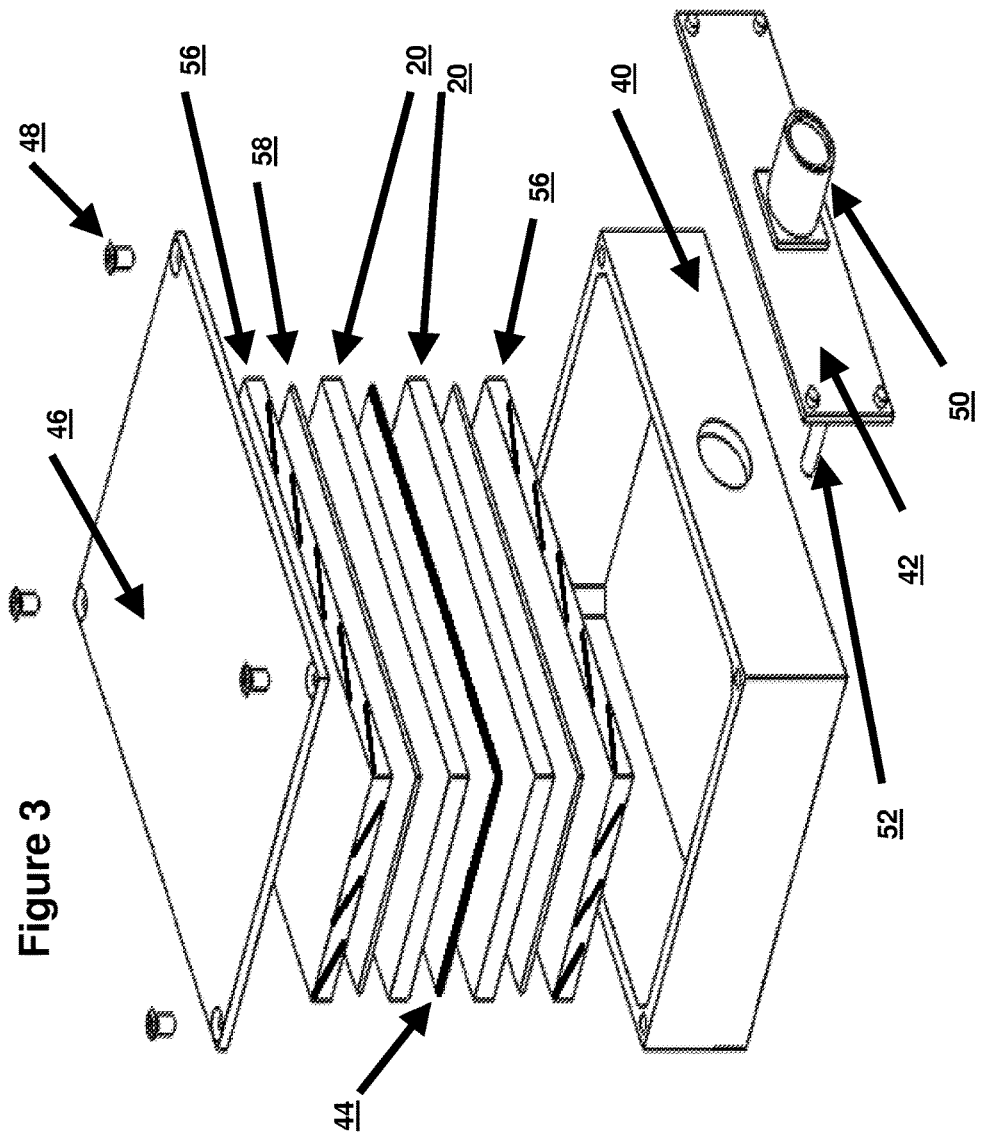
FIG. 3 is an exploded view of the major packaged components that define the physical attributes and dynamic packaging of this advanced lithium polymer system.

FIG. 3 in concert with all other figures illustrates an exploded view of all components that are integrated into enclosure base 40 and bounded by enclosure lid 46 and secured into position by enclosure securing screws 48. The main components resident in function integrated electronics card 42 are intelligent-cell electronics card 18, communications system 24 and schottky diode 34, integrated and communicating with communications/power connector 50 forming a complete integrated unit along with interface harness 52. Cell heater strips 44 are mounted as required parallel to cells 1 through cell X 20. Additionally illustrated is dynamic reactive foam 56 and how it interfaces with dynamic slip surface 58 which in turn sandwiches cells 1 through cell X 20 along with cell heater strips 44.

Figure 4:
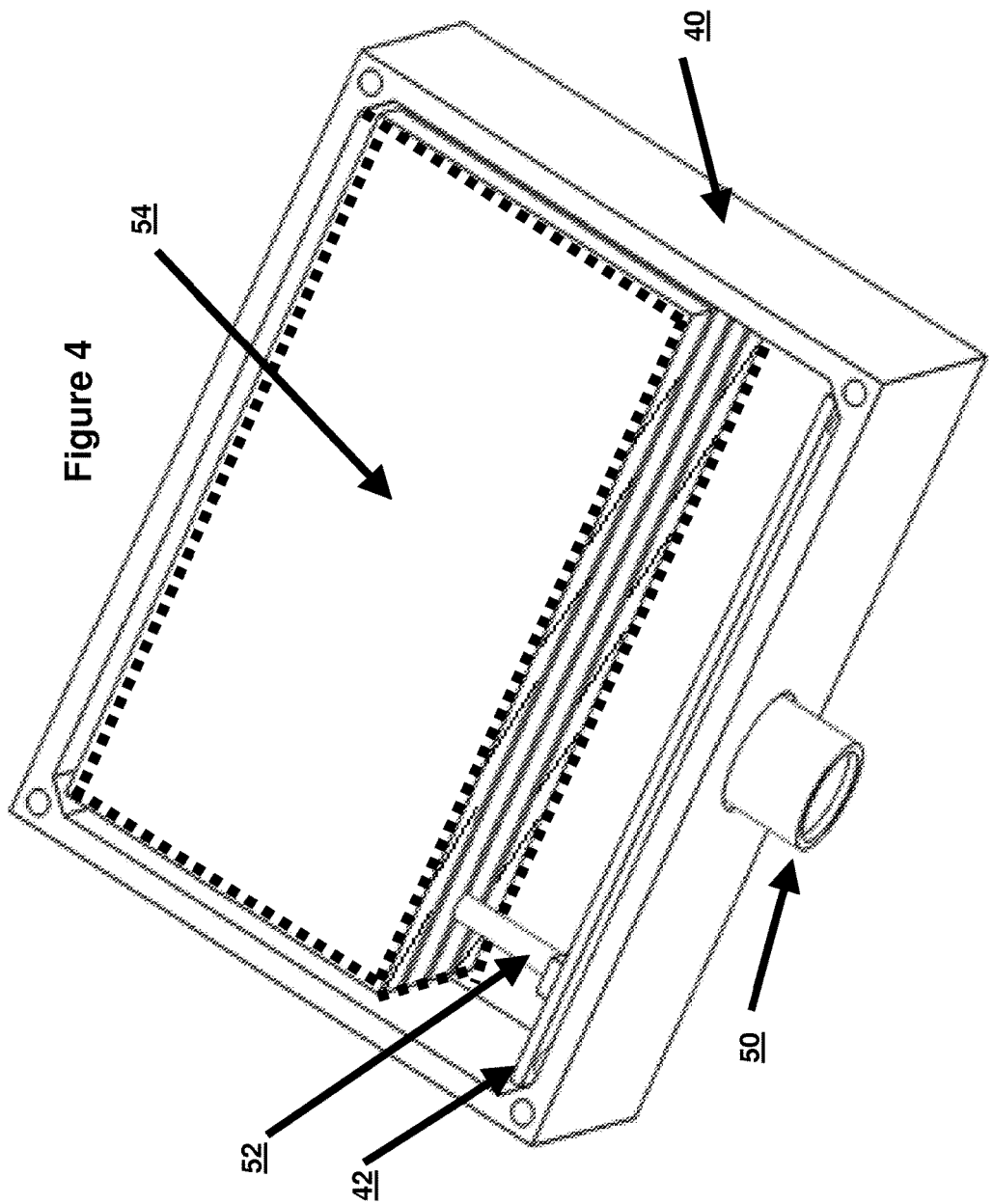
FIG. 4 depicts an open-box view of all integrated components illustrating the compactness and ruggedized nature of the advanced lithium polymer system.

FIG. 4 in concert with all other figures illustrates an open package view of integrated cells 1 through cell X 20 and cell heater strips 44 assembly comprising integrated stack 54 comprised of cells 1 through cell X 20, cell heater strips 44, dynamic reactive foam 56, dynamic slip surface 58 and function integrated electronics card 42. Interface harness 52 provides electrical connectivity between integrated stack 54 and function integrated electronics card 42.

FIG. 5 in concert with all other figures illustrates the electrical details associated with the advanced lithium power system 10, and focuses on the operation of battery management system 82, electrically isolated cell monitoring system 84 and its interfaces to GUI display 62. The two main pathways routed from power/communications connector 50 split into power and communication functions and branch from charging input 28, 28 volt detector connection 70 and ICP positive terminal connection 32. Power and electromagnetic filtering is accomplished in DC voltage converter and EMI filter 66 via power cable 68, which then splits off to power system ground 38 and into communications processor 24 via power cable 64 which in-turn has a bi-directional output back through power/communications connector 50 via external communications portal 26 and finally interfacing with GUI display 62 via GUI interface cable 60. The other pathway from power/communications connector 50 controls charging mosfet 78 via mosfet power cable 74, with charging mosfet 78 having a direct interface with battery management system 82. Gate override logic system 76 interfaces with power/communications connector 50 via override logic cable 72, and provides override signals to discharge mosfet 80 in the event of an emergency situation whereby the battery management system 82 might have some issue functioning correctly, allowing completion of the mission if safety is not at risk. Communications processor 24 also interfaces with electronically isolated cell monitoring system 84 via I2C communications cable 92 to monitor cells 1 through cell X 20. Sampling of current stability is sensed via current sense amplifier 90, picking off its signal after current sense resistor 86 via current sensor lead 88, and completing the electrical pathway to ground via power system ground 38.

Operation—FIGS. 1-5

Advanced lithium polymer system 10 as illustrated in FIGS. 1-5 is an integrated consortium of functional hardware, firmware and software responsibilities interacting to form a single whole system. Within this advanced lithium polymer system 10, the power system 12 and communications system 14 seamlessly interact with each other to produce a highly stable and reliable dense electrical energy source measurable between power system output 36 and power system ground 38 terminals.

Command and control of the power system 12 is achieved via the communications processor 24 of communications system 14. The main capabilities of the communications processor 24 include the ability to monitor and transmit voltage, current and temperature of cells 1 through cell X 20 via cells 1 through cell X output connection 22 in addition to providing full battery conditioning and cell balancing of cells 1 through cell X 20 within ICP1 through ICPx 16 and also provide automatic over charge, under voltage and short circuit protection of the entire configuration. Opto isolated I2C communication port 30 interfaces with intelligent-cell electronics card 18, with ICP1 through ICPx 16 being independent and isolated from each other via schottky diode 34. A redundant structure of cells 1 through cell X 20 is also employed in the event of a catastrophic failure of any one cell. Charging input 28 directly, indirectly or inductively charges cells 1 through cell X 20 contained within ICP1 through ICPx 16 via ICP positive terminal connection 32. External communications portal 26 accommodates practically every type of flexible communications standard available, including but not limited to RS-422, RS-232, 1553, USB and I2C. Communications processor 24 also internally utilizes an intelli-com opto isolated internal I2C bus input interfacing with intelligent-cell electronics card 18 via opto isolated I2C communication port 30.

Intelligent-cell electronics card 18 utilizes but is not limited to an industry standard opto isolated I2C communication capability and embedded software enabling automatic over charge, under voltage and short circuit protection for cells 1 through cell X 20 internal to ICP1 through ICPx 16.

Communications/power connector 50 is the single point interface between power system 12, communication system 14, charging input 28, power system output 36 and external communications portal 26. Full end-to-end operational functioning of integrated electronics card 42 employs the resources of intelligent cell electronics card 18, communications processor 24, opto isolated I2C communication port 30, ICP positive terminal connection 32, schottky diode 34 and power system ground 38. Interface harness 52 provides bi-directional connectivity between all functions communicating through function integrated electronics card 42 and integrated stack 54 which comprise advanced lithium polymer system 10.

Physical constraint of cells 1 through cell X 20 and integrated cell heater strips 44 comprising integrated stack 54 comprised of cells 1 through cell X 20, cell heater strips 44, dynamic reactive foam 56, and dynamic slip surface 58 provide the framework for cells 1-X 20 to function in the vacuum of space without ballooning out and causing cathode and anode separation which results in battery degradation and failure. Additionally, integrated stack 54 mitigates all shock, vibration and thermal effects associated with the rigors of travel to space and subsequent deployment in space.

Health monitoring of the advanced lithium polymer system 10 is accomplished internally via electrically isolated cell monitoring system 84, and also externally via GUI display 62. GUI display 62 interfaces to data connector 50 via GUI interface cable 60 which in-turn interfaces to communications processor 24 via bi-directional external communications portal 26. Communications processor 24 bi-directionally interfaces with electronically isolated cell monitoring system 84 through opto isolated I2C communications port 30 via I2C communications cable 92. Electronically isolated cell monitoring system 84 also communicates with cells 1 through cell X 20 and current sensing amplifier 90 in concert with current sense resistor 86 and current sensor lead 88 to insure cells 1 through cell X 20 are functioning nominally.

Power/communications connector 50 additionally interfaces with charging input 28, 28 volt detector connection 70 and ICP positive terminal connection 32. Routing of power from power/communications connector 50 extends through to DC voltage converter and EMI filter 66 via power cable 68 which in turn powers communications processor 24 via power cable 64 and also returns to power system ground 38. Simultaneously, the output of power/communications connector 50 also is routed to battery management system 82 via mosfet power cable 74, which allows charging of cells 1 through cell X 20 via enabling of charge mosfet 78. Discharge of cells 1 through cell X 20 is accomplished via command of battery management system 82 via discharge mosfet 80. In the event of an emergency situation where delivery of power is paramount, battery management system 82 can be overridden via command from gate override logic system 76 is connected to power/communications connector 50 via override logic cable 72 which forces discharge mosfet 80 to close and allow power from cells 1 though cell X 20 to flow.

ADVANTAGES

From the description above, a number of advantages of the following qualities are exhibited by the components that comprise this safe, modular, scalable, expandable, deployable, employable, practical, radiation hardened, and intelligently controlled advanced lithium polymer system which can be used in any environment from the most benign earth based all the way through the harshest environment of space or during the transit between the two:

1) The incorporation of a simple and scalable architecture that reduces size, volume and weight also provides real-time monitoring and feedback of the battery's individual cell voltages, temperatures and current with a minimum of components, external wires or wire bundles.

2) Implementation of this system's architecture minimizes all components and internal wiring, while allowing for full battery conditioning and cell-balancing.

3) Real-time data from the battery's health and status condition is provided for data collection and storage on an individual cell level, no matter what the size of the integrated system.

4) Special built in and separated/isolated circuitry provides automatic over charge, under voltage, and short circuit protection of the battery, no matter what size/volume/weight of the total integrated system.

5) A safe fail-over mechanism is also employed on an individual cell basis to insure a rapid and safe shutdown of a battery in the event of a catastrophic failure of any one cell, without the size or weight of the overall integrated system being of consideration.

6) The overall system approach to this invention is to be of a modular 'Lego' battery structure from ounce size through practically no upper limit that can be rapidly and flexibly configured/reconfigured for multiple operational requirements, resulting in a drastic reduction of qualification costs due to the commonality of the hardware, firmware and software.

7) A hybrid combination of the lithium polymer battery system and an external/easily integrated recharging power source such as a fuel cell or solar panel system makes it possible to quickly recharge the battery system no matter what size is employed, resulting in the world's most sustainable, power-dense capability.

8) This entire lithium power system is comprised of safe, modular, scalable, expandable, deployable, employable, practical and intelligently controlled lithium battery cells of practically any size, allowing any desired configuration to be efficiently assembled without additional engineering or cumbersome additional wiring.

9) This advanced lithium power system utilizes redundant and electrically isolated parallel battery strings no matter what size the implementation, for graceful power reduction in case of a cell failure.

10) The small physical operating envelope possible with the advanced lithium power system allows for its use internally/externally with avionics systems, and broad use in aerospace applications such as pico-satellites, nano-satellites, rockets, missiles, unmanned aerial vehicles, reusable launch vehicles, etc. where size, robustness and safety are of paramount importance.

11) A significant reduction in operations/maintenance costs to approximately one tenth of previous battery systems occur with the much improved battery energy density of the pouch-style lithium polymer battery, which is approximately three to seven times that compared to other aerospace rechargeable batteries currently being used such as silver zinc, nickel cadmium, nickel metal hydride and lead acid.

12) In harshly cold environments, ultra-thin strip heaters can be inserted in-between individual flat lithium polymer pouch cells of practically any dimension to provide individual heating with thermal control, with no practical impact to overall battery dimension.

13) The entire advanced lithium power system as defined by this invention is essentially shock and vibration immune when integrated with the dynamic packaging characteristics detailed therein, enabling its use in practically every aerospace vehicle in every launch/on-orbit harsh environment.

14) The never-before demonstrated expandable or collapsible architecture of the advanced lithium polymer system is adaptable to fit practically any mechanical footprint for broad use in military and industrial applications.

15) The modular and scalable bus architecture of the advanced lithium power system is independent of order, series/parallel arrangement, or voltage, and takes up a fraction of the size/weight when compared to alternate architectures which are cumulative wiring intense, allowing its instant use on pico-satellites, nano-satellites, any size satellite, unmanned aerial vehicles, or any vehicle in general where the ultimate safe power source is required.

16) All the individual lithium polymer battery cells of this invention are completely scalable from the smallest to the largest size, are uniquely addressable, and can simply communicate real-time health and status parameters for immediate battery evaluation and automatic shutdown in case of an individual battery cell failure.

17) A simply integrated computer display allows for lithium polymer battery performance monitoring, data collection and storage, including data on battery cell voltages, temperature, current, state of charge and overall charge/discharge cycle parameters, along with all critical data for a safety evaluation.

18) This entire lithium polymer battery system can be reconfigured based on mesh network topologies and redundant power switching in any configuration, especially if employed in a swarm of orbiting pico, nano, or other satellite constellations.

19) This advanced lithium polymer battery system can be employed in the harshest of environments known to mankind with the greatest simplicity and smallest physical size possible, serving everything from the smallest of satellites from the ounce range through the larges size in orbit, in addition to all other aerospace platforms previously served by legacy and recent lithium-ion systems, whether on earth in a benign atmospheric environment or in the harsh demanding realm of space or during the transit to space.

(20) The simple and elegant design philosophy behind this invention allows for its scalability from ounce size through practically no upper limit due to its modular practical design.

(21) Employment of the advanced chemistry and manufacturing techniques for the pouch-style lithium polymer battery allow for an unprecedented rapid recharge time in 45 minutes or less, allowing it to serve the previously untapped market of low earth orbital applications.

(22) The successful employment of this invention in realms outside of the atmosphere is made possible by its never-before physical architecture that physically constrains the lithium polymer pouch from expanding while maintaining full operability.

(23) The battery management system employed as part of this invention will monitor each lithium polymer cell real-time while in any environment, whether it is in the benign realm of being earth-based surrounded by an atmosphere and nominal temperatures, or in the extreme vacuum harsh environment of space where temperatures vary instantly by 500 degrees Fahrenheit going from sunlight to darkness.

(24) The employment of a dynamic cell packaging system with any number of stacked lithium polymer pouch cells allows for its survival in any extreme shock, vibration, thermal or other military standard environment that has been defined or imposed.

(25) The expansion and contraction of stacked pouch-style lithium polymer cells during charge and discharge is accommodated by using a dynamic packaging method that functions in response to and in concert with external factors such as shock, vibration, thermal cycling and vacuum during deployment in the harsh environment of space.

(26) The modular and simplistic design philosophy underpinning this invention allows for it to monitor the status of each individual pouch lithium polymer cell during any phase of employment from close by via hardwire, to many miles distant via telemetry.

CONCLUSION, RAMIFICATIONS AND SCOPE

Accordingly, the reader will see that the type of power system defined by this invention is the embodiment of virtues that unequivocally make the advanced lithium polymer system the world's leading embodiment for all vehicles requiring the ultimate flexibility and safety to take advantage of the world's leading energy density chemistry available in lithium battery cells, especially the pouch style. In order for any lithium power battery system to be practical and competitive in the marketplace with the legacy silver-zinc, lead acid etc. batteries in common use today, it must exhibit the qualities of first and importantly safety, practicality, modularity, scalability, expandability, deployability and employability, along with the ability to be radiation hardened, while being an intelligently controlled system employing the smartest condensed thoughtful architecture possible which automatically eliminates massive wiring and components which plague all other proposed architectures evident in the prior art referenced in this patent.

With the advent of the advanced lithium polymer system into the marketplace, commercial, military, educational and all other users will no longer be held to the inefficient and rudimentary nature of the power system options available prior to this invention. Additionally, it is worthwhile to point out that with the cost to place a pound of payload into low earth orbit in the $20,000 range, this advanced lithium power systems will typically save at least 100 plus pounds on most launch vehicles, roughly enabling at minimum, approximately $2 million dollars of additional revenue payload to now occupy what was once the weight/volume previously occupied by the legacy silver zinc lead acid, or even lithium-ion chemistries.

Further, with this invention, other recent energy dense technologies such as solar panels or fuel cells can be used in a hybrid combination to synergistically produce phenomenal miniature power sources/recharging capabilities unheard of in today's operational battery environment, especially for use on smaller satellites due to the ability of the lithium polymer battery to rapidly recharge due to its very low internal resistance. In this hybrid configuration, an array of industries can greatly expand their present envelope of operations with this new compact and energy-dense power source.

Additionally, with this invention, any user will have a simple, coherent, instant and extremely deployable/usable system for integrating the substantial benefits of an advanced lithium polymer system into their mission requirements and profile. Furthermore, the advanced lithium polymer system has the additional advantages in that:

it permits a user to have great insight with simple wiring configurations into the internal workings of their employed version of the advanced lithium polymer system.

it enables the long-term stability benefits afforded through conditioning and balancing of individual battery cells in the simplest way, which prolongs their life.

it makes possible for the first time, the ability to gather real-time data on the performance of a lithium polymer battery cell in the harsh environment of space, routinely down to the cell level, even when used in a satellite.

it offers the lithium polymer battery protection from catastrophic circumstances arising due to over voltage charge, under voltage and short circuit.

it affords flexibility in the lithium polymer battery system's operation through redundancy and fail-over/fail-safe functionality on any vehicle it is mounted on.

it leverages the Lego/matrix-like scalability in hardware/software to provide any size and configuration battery that a user might require while using a minimum of wires compared to all other methods, thus making this employment possible on vehicles where size/weight are at a premium and cost upwards of $20,000 per pound.

it is easily combinable with other parallel synergistic power systems in a simplistic way such as with solar panels or fuel cells to create an entirely new hybrid power system entity still based upon the scalability modularity and intelligence of its building block matrix style architectural design in hardware and software.

it is capable of instantly being reconfigured into a larger or smaller system based upon a customer's changing needs, with no limits in either size direction, and without adding any significant additional wiring.

it is instantly and intelligently capable of reconfiguring itself internally into a real-time safe condition during any mission phase on any size vehicle, to insure mission success in the event of any quickly changing system parameters of hardware or software.

it provides the most cost effective means for powering practically any type of aerospace or other similar requirement system by supplying the densest power system possible in the smallest amount of space.

it offers the most maintenance-free power capability to have ever been invented, and its simplicity of operation powers anything at least 2 or 3 times longer than the best capability available today while being the simplest and most elegant to employ on any size platform.

it functions in the harshest temperature environments ever encountered by aerospace vehicles, with considerable margin leftover and available to meet any changing mission requirements.

it is shock and vibration tolerant under practically any circumstance which is unmatched by any other power system, and is due to the robust nature of lithium polymer batteries which have the absolute minimum amount of electrolyte, thus keeping the battery safer than any other battery under all conditions.

it is usable in practically any space due to its smart condensed architecture, where heating/venting may have been an issue with previous battery systems.

it has a matrix design which doesn't restrict the arrangement of internal battery cells to provide the desired energy output, and doesn't wield an unmanageable huge wire bundle as the capacity of the system is increased with additional cells.

it includes a simply interfaced robust real-time computer monitoring capability displaying health and status for each individual cell in addition to the overall battery system health, whereas all other battery systems cannot do it with the minimum number of wires as this advanced lithium power system does with any size application weighing from ounces at the low end, with practically no limit on the upper end.

it comes from a long heritage of battery reliability with roots in the consumer electronics environment, and as a building block of this invention, it affords the underlying power capability necessary for use in expensive delicate aerospace and other systems due to the innovative architectural methods employed by therein, which minimizes structure, wiring, shock and vibration.

it is capable of being arranged into a large network such as a swarm of small satellites, and can be operated automatically by a master controller based upon mesh network topologies that can benefit from the increased power density afforded by the embodiment of this invention.

it satisfies all of the demanding criteria required by missile and rocket manufacturers for safe, modular, scalable, expandable, deployable, employable, practical, radiation hardened, and intelligent control on the world's most expensive and mission critical launch vehicles.

it is scalable from the smallest application size to largest, thus satisfying any number of diverse mission needs on practically any platform being considered for its employment, whether terrestrially based in a benign earth environment, or in the extreme opposite end where space is the harshest of environments.

it has at its heart a battery chemistry and cell construction method, which allows for the most rapid recharge available on the market today, enabling full power delivery during the dark side of an orbit for many thousands of cycles over the lifetime of a satellite.

it is smartly designed to dynamically constrain the expansion of any and all pouch cells in the vacuum of space, which would normally render the cells inoperable due to expansion and subsequent internal anode and cathode cell plate separation causing significant capacity loss.

it takes the employment of stacked pouch lithium polymer cells into a new application beyond the remote control airplane realm whereby the constant real-time monitoring of each individual cell is paramount.

it employs a never before demonstrated packaging method to minimize shock and vibration levels down to acceptable levels for full survivability where all other battery systems would fail.

it accommodates the irregular shaping which occurs during charge and discharge of individual cells, and insures that this shaping in combination with other environmental parameters such as shock, vibration, vacuum and thermal will not preclude the overall ability of the system to deliver the required voltage and current under all conditions.
it will provide health and status measurements of the system down to the individual cell level real-time during all phases of employment, even flight under all conditions.

Although the description above contains many specifications, these should not be construed as limiting the scope of the invention, but merely providing illustrations of the presently preferred embodiment of this invention. The essence and discriminator of this invention is that of being the first time a lithium polymer chemistry, particularly a pouch-style of lithium polymer chemistry has been successfully employed from a single through a multiple cell level of practically any size in any environment from benign atmospheric earth conditions to the harshness of space, is adaptable down to pico and nano-satellite sizes of only ounces in weight, thus enabling the pico and nano-satellite/smaller and larger satellite markets to flourish for the first time with a safe, modular, scalable, expandable, deployable, employable, practical, radiation hardened and intelligent control capability integral to a battery system.

The smart architecture of this advanced lithium polymer system by its nature minimizes size and its wiring to unprecedented miniature modular sizes, which in turn make it practical for employment on aerospace/like vehicles where the integrated qualities of this system are required and paramount due to safety and the cost of placing a payload into orbit. Without the efficient and safe employment of the lithium polymer chemistry as described by this invention, there is really no system that could be recommended for use in any application where ultimate reliability in combination with compactness and safety is paramount. This advanced lithium polymer system solves all the prior problems of correctly managing the lithium polymer chemistry in the smallest size and weight footprint, so it can be used efficiently in applications where previous silver zinc and lead acid and even lithium-ion etc. batteries were employed, and is actually the first time a battery system can be employed without modification within the benign environment of atmospheric effects of earth and also instantly deployed into the harsh environment of the vacuum of space without modification, along with the shock, vibration and other external influences experienced as a rocket transits into space. Thus, the scope of this invention should be determined by the appended claims and their legal equivalents.

The invention claimed is:

1. An advanced power system capable of continual operation within nominal atmospheric earth conditions and the vacuum of space, including the worst-case environments associated with transit into space comprising:
   (a) a plurality of single flat stackable pouch lithium polymer battery cells in series or parallel configuration structured as a battery cell stack physically secured by a dynamic constraint system in a sandwich type manner bolted down in all corners of said battery cell stack with a layered dynamic reactive foam means on the top and bottom of each said battery cell stack that also accommodates thin strip heaters between said flat pouch batteries, said dynamic constraint system configured to prevent expansion of said pouches while said battery cell stack resides in a vacuum and all typical temperature variations while in space ranging from minus 270° C. to plus 120° C.,
   (b) said dynamic constraint system configured to mitigate the effects of extreme shock and vibration in all axes to preclude torn and stressed said pouch cells and simultaneously mitigate associated extreme environmental factors upon said pouch cells that include extreme thermal changes of a rocket launch and satellite orbit, further configured to accommodate the expansion and contraction in thickness of said pouch cell during charge and discharge,
   (c) said battery cell stack collectively structured as a cell pack integral with an electronic controller card programmed to regulate charge and discharge of said cell pack while it simultaneously protects, balances and monitors each cell in said battery cell stack for safety,
   (d) said cell packs collectively controlled by a battery management system whether configured singly as one cell pack or multiple cell packs, whereby said electronic controller card functions independently if a failure occurs with said battery management system,
   (e) said cell pack collectively structured as a power system configured either singly or with multiple said cell packs that are electronically isolated from each other with Schottky diodes, further configured to interface with the electronic controller,
   (f) said electronic controller card programmed to override all nominal discharge parameters of said battery management system if required,
   (g) said power system and said electronic controller card together comprise said advanced power system and are configured to interface with a graphical user interface display to visually monitor and manually control charge, discharge, protection and balance of said battery cells within said power system.

2. The advanced power system of claim 1 configured to operate in a radiation-hardened configuration and simultaneously provides a human interface means for purpose of reconfiguration and real-time monitoring of voltage, current, state of charge, state of health and temperature of any number of said individual battery cells via a hardwire means or a telemetry system means.

3. The advanced power system of claim 2 configured to operate in a radiation-hardened configuration and simultaneously provides a human interface means for purpose of reconfiguration and real-time monitoring of voltage, current, state of charge, state of health and temperature of any number of said individual battery cells via a hardwire means or a telemetry system means.

4. The advanced power system of claim 3 further comprising a total integrated structure that meets all space launch and orbit requirement specifications of extreme acceleration, shock, vibration, thermal cycle, vacuum, radiation and electromagnetic interference parameters.

5. The advanced power system of claim 4 whereby said advanced power systems are integrated into a mesh network comprised of multiple said power systems of no defined limit in number, being interactive and capable of flexible control and power transfer per defined specific mission requirements.

* * * * *